(12) United States Patent
Huang et al.

(10) Patent No.: US 7,355,250 B2
(45) Date of Patent: Apr. 8, 2008

(54) ELECTROSTATIC DISCHARGE DEVICE WITH CONTROLLABLE HOLDING CURRENT

(75) Inventors: Chih-Feng Huang, Jhubei (TW);
Ta-yung Yang, Milpitas, CA (US);
Jenn-yu G. Lin, Taipei (TW);
Tuo-Hsin Chien, Tucheng (TW)

(73) Assignee: System General Corp., Taipei, Hsien (TW)

(*) Notice: Subject to any disclaimer, the term of this patent is extended or adjusted under 35 U.S.C. 154(b) by 73 days.

(21) Appl. No.: 11/222,707

(22) Filed: Sep. 8, 2005

(65) Prior Publication Data

US 2007/0052030 A1    Mar. 8, 2007

(51) Int. Cl.
*H01L 23/62* (2006.01)
*H01L 29/76* (2006.01)
*H01L 29/94* (2006.01)
*H01L 31/062* (2006.01)
*H01L 31/113* (2006.01)

(52) U.S. Cl. ............. 257/355; 257/173; 257/174; 257/356; 257/357; 257/358; 257/359; 257/360; 257/361; 257/362; 257/363; 257/372; 257/373; 257/374; 257/375; 257/376

(58) Field of Classification Search ........ 257/355–363, 257/372–376, 173–174
See application file for complete search history.

(56) References Cited

U.S. PATENT DOCUMENTS

| | | | | |
|---|---|---|---|---|
| 5,343,053 A | * | 8/1994 | Avery | 257/173 |
| 5,424,565 A | * | 6/1995 | Kemmer | 257/290 |
| 5,932,914 A | * | 8/1999 | Horiguchi | 257/355 |
| 6,396,109 B1 | * | 5/2002 | Hutter et al. | 257/372 |
| 6,399,990 B1 | * | 6/2002 | Brennan et al. | 257/355 |
| 6,406,953 B1 | * | 6/2002 | Li et al. | 438/199 |
| 6,465,848 B2 | * | 10/2002 | Ker et al. | 257/355 |
| 6,493,199 B1 | * | 12/2002 | Su et al. | 361/56 |
| 6,570,226 B1 | * | 5/2003 | Groeseneken et al. | 257/361 |
| 6,690,067 B2 | * | 2/2004 | Ker et al. | 257/355 |
| 6,833,592 B2 | * | 12/2004 | Lee | 257/372 |
| 6,960,792 B1 | * | 11/2005 | Nguyen | 257/173 |
| 7,023,029 B1 | * | 4/2006 | Vashchenko et al. | 257/173 |
| 2002/0063297 A1 | * | 5/2002 | Lee | 257/371 |
| 2003/0102485 A1 | * | 6/2003 | Chen et al. | 257/119 |
| 2003/0202300 A1 | * | 10/2003 | Tyler et al. | 361/56 |
| 2006/0186467 A1 | * | 8/2006 | Pendharkar et al. | 257/337 |

* cited by examiner

*Primary Examiner*—Ida M. Soward
(74) *Attorney, Agent, or Firm*—J.C. Patents

(57) ABSTRACT

An electrostatic discharge (ESD) device with a parasitic silicon controlled rectifier (SCR) structure and controllable holding current is provided. A first distance is kept between a first N+ doped region and a first P+ doped region, and a second distance is kept between a second P+ doped region and a third N+ doped region. In addition, the holding current of the ESD device can be set to a specific value by modulating the first distance and the second distance. The holding current is in inverse proportion to the first distance and the second distance.

23 Claims, 4 Drawing Sheets

ELECTROSTATIC DISCHARGE DEVICE WITH CONTROLLABLE HOLDING CURRENT

BACKGROUND OF THE INVENTION

1. Field of the Invention

The present invention relates to an electrostatic discharge (ESD) device, and more particularly, to an ESD device with parasitic silicon controlled rectifier (SCR) structure and controllable holding current.

2. Description of the Related Art

ESD devices are widely applied in integrated circuits (IC) for preventing damage caused by static electricity. However, a latch-up effect inevitably exists since the inherent characteristics of the parasitic SCR structure of the ESD device. When the SCR structure is triggered, the ESD device can endure high currents. However, the voltage across the SCR would snap back to a low-holding voltage, which causes the latch-up effect. As the SCR structure is latched up, the ESD device cannot return to the normal operation state and fails to function normally.

How to improve the latch-up immunity of the ESD device has become a major issue in designing the ESD device nowadays. Accordingly, an ESD device having controllable holding current to improve the latch-up immunity is especially desired.

SUMMARY OF THE INVENTION

Therefore, it is an objective of the present invention to provide an ESD device with controllable holding current, and the holding current of the ESD device can be determined as required without any adjustment to the process.

According to one aspect of the present invention, an ESD device with controllable holding current provided by the present invention comprises a P-type substrate, an N-well, a first N+ doped region, a first P+ doped region, a second N+ doped region, a second P+ doped region, a third N+ doped region, a first electrode, and a second electrode. The N-well is formed inside the P-type substrate. The first N+ doped region and the first P+ doped region are formed inside the N-well, and a first distance is kept between the first N+ doped region and the first P+ doped region. The third N+ doped region is formed inside the P-type substrate and outside the N-well, and the third N+ doped region is isolated from the N-well. In addition, the second P+ doped region is formed inside the P-type substrate and outside the N-well. The second P+ doped region is isolated from the N-well. A second distance is kept between the second P+ doped region and the third N+ doped region. Moreover, the second N+ doped region is disposed between the first P+ doped region and a first field oxide. The second N+ doped region is isolated from the third N+ doped region by the first field oxide. The first electrode is electrically coupled to the first N+ doped region and the first P+ doped region via a first electric conductor. The second electrode is electrically coupled to the second P+ doped region and the third N+ doped region via a second electric conductor. Furthermore, the holding current of the ESD device can be determined by modulating the first distance and the second distance.

According to another aspect of the present invention, an ESD device with controllable holding current provided by the present invention comprises a P-type substrate, an N-buried layer, an N-well, a P-well, a third P+ doped region, a fourth N+ doped region, a fourth P+ doped region, a fifth N+ doped region, a fifth P+ doped region, a third electrode, and a fourth electrode. The N-buried layer is formed inside the P-type substrate, and the N-well is formed on the N-buried layer. The P-well is formed on the N-buried layer and is adjacent to the N-well. The fourth N+ doped region and the third P+ doped region are formed inside the N-well. A third distance is kept between the fourth N+ doped region and the third P+ doped region. In addition, the fourth P+ doped region and the fifth N+ doped region are formed inside the P-well. A fourth distance is kept between the fourth P+ doped region and the fifth N+ doped region. The fifth P+ doped region is disposed between the fifth N+ doped region and a fourth field oxide. The fifth P+ doped region is isolated from the third P+ doped region by the fourth field oxide. Moreover, the third electrode is electrically coupled to the fourth N+ doped region and the third P+ doped region via a third electric conductor. The fourth electrode is electrically coupled to the fourth P+ doped region and the fifth N+ doped region by a fourth electric conductor. Furthermore, the holding current of the ESD device can be determined by modulating the third distance and the fourth distance.

In the present invention, since an ESD device with the parasitic SCR structure and the controllable holding current is applied, the holding current of the ESD device can be changed by modulating the distance between the P+ doped region and the N+ doped region. Accordingly, the holding current of the ESD device is determined according to the actual requirements without adjusting the IC process.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE PREFERRED EMBODIMENTS

Reference will now be made in detail to exemplary implementations, which are illustrated in the accompanying drawings. Wherever possible, the same reference numbers will be used throughout the drawings to refer to the same or like parts.

The following examples and implementations overcome the disadvantages of conventional ESD devices and reduce the size and cost for IC manufacturing. In accordance with the embodiment of the present invention, an ESD device is formed with a plurality of N+ doped regions and a plurality of P+ doped regions that are formed inside an N-well. Wherein the N+ doped regions and the P+ doped regions are formed in a sequence in an interleaved manner, and the regions located at two ends of the sequence are the N+ doped regions. In addition, some P+ doped regions and N+ doped regions are jointly coupled to a first electrode via a conductor, and a distance between the connected P+ doped region and N+ doped region is adjustable. By adjusting the distance, a trigger voltage and a relative holding current of the ESD device can be modulated.

The ESD device is also formed with a plurality of P+ doped regions and a plurality of N+ doped regions outside the N-well, wherein the P+ doped regions and N+ doped regions are jointly coupled to a second electrode. A distance between the connected P+ doped region and N+ doped region is adjustable. By adjusting the distance, the trigger voltage and relative holding current of the ESD device can be modulated.

Moreover, the ESD device is formed under a pad, and connected to the pad by metal. Since the pad is an ideal conductor, the current flowing from the pad to the ESD devices is well distributed, which improves the performance of ESD device. Since the ESD devices are formed under the pad, the practical area and cost for the IC manufacturing are effectively reduced.

Figure 1:
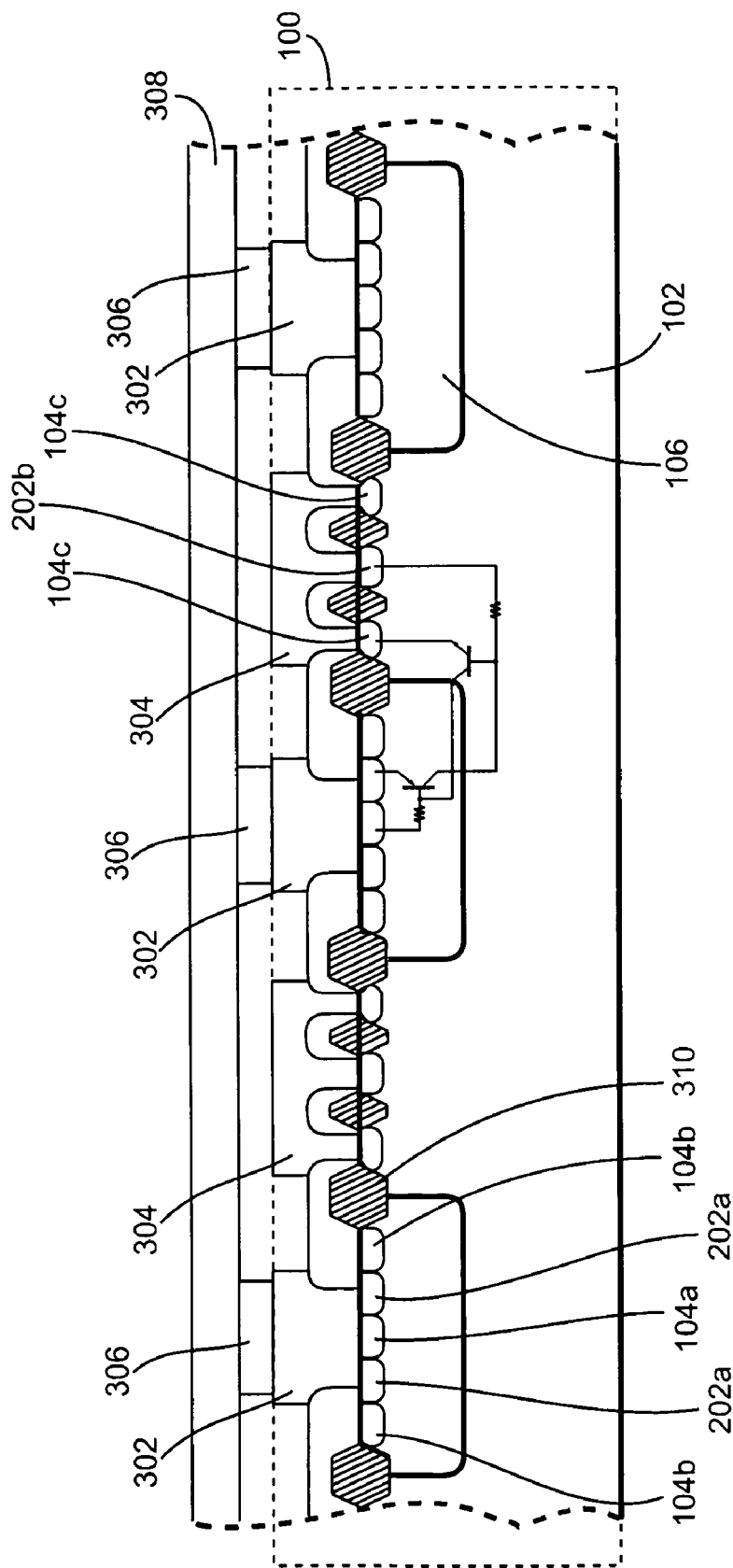
FIG. 1 schematically shows a cross-sectional diagram of an ESD device with a parasitic SCR structure according to an embodiment of the present invention.

FIG. 1 schematically shows a cross-sectional diagram of an ESD device 100 with a parasitic SCR structure and controllable holding current according to an embodiment of the present invention. Referred to FIG. 1, the ESD device 100 is formed inside a P-type substrate 102, and comprises an N-well 106, a first N+ doped region 104a, a first P+ doped region 202a, a second N+ doped region 104b, a third N+ doped region 104c, a second P+ doped region 202b, and a first field oxide 310. The connected complementary doped regions, such as: the first N+ doped region 104a and the first P+ doped region 202a, operate under unequal voltage level when the ESD device 100 is triggered by electrostatic discharge phenomenon.

As shown in FIG. 1, two equivalent transistors and two internal resistors form an equivalent SCR structure of the ESD device 100. The first P+ doped region 202a, the N-well 106, and the P-type substrate 102 together form an equivalent transistor. The N-well 106, the P-type substrate 102, and the third N+ doped region 104c together form another equivalent transistor. The second N+ doped region 104b is isolated from the third N+ doped region 104c by the first field oxide 310. In addition, a first electrode is electrically coupled to the first N+ doped region 104a and the first P+ doped region 202a via a first electric conductor 302. A second electrode is electrically coupled to the second P+ doped region 202b and the third N+ doped region 104c via a second electric conductor 304. The electric conductors 302 and 304 can be made of metals. In the present embodiment, the first electrode is electrically coupled to a pad 308 through a via 306. The second electrode is electrically coupled to a power terminal or a ground terminal (not shown) through the same. Alternatively, the second electrode may be electrically coupled to the pad 308, and the first electrode may be electrically coupled to the power terminal or the ground terminal by one of the ordinary skill in the art based on the actual requirements. When the electrostatic voltage increases, a transient current flowing through the ESD device 100 induces a voltage difference between the connected complementary doped regions pairs 104a-202a and between 104c-202b via the internal resistors. The complementary doped regions aforesaid means different type doped regions, such as the N-type doped region and the P-type doped region.

As shown in FIG. 2A~2D, the relative distance between the first N+ doped region 104a and the first P+ doped region 202a is referred as $d_1$. The relative distance between the third N+ doped region 104c and the second P+ doped region 202b is referred as $d_2$. The distances $d_1$ and $d_2$ can be kept with or without insulators, such as: the field oxides, for modulating the holding current of the ESD device 100. In addition, the insulator between the first N+ doped region 104a and the first P+ doped region 202a may be a second field oxide, and the insulator between the second P+ doped region 202b and the third N+ doped region 104c may be a third field oxide.

As the distances $d_1$ and $d_2$ increase, the resistance of the internal resistors will increase accordingly, which decreases the holding current of the ESD device 100. On the contrary, as the distances $d_1$ and $d_2$ decrease, the resistance of the internal resistors will decrease accordingly, which increases the holding current of the ESD device 100. Moreover, the trigger voltage and the holding current of the ESD device 100 are in inverse proportion to the distances $d_1$ and $d_2$. Therefore, the holding current of the ESD device 100 can be set to a specific value by modulating the distances without adjusting the process. To illustrate with an example, the first distance $d_1$ and/or the second distance $d_2$ can be set to zero, so as to enlarge the holding current of the ESD device 100. Furthermore, the ESD device 100 may be formed under the pad and connected with each other by metals, which makes use of the space under the pad and saves substantial cost for the IC manufacturing.

Figure 2A:
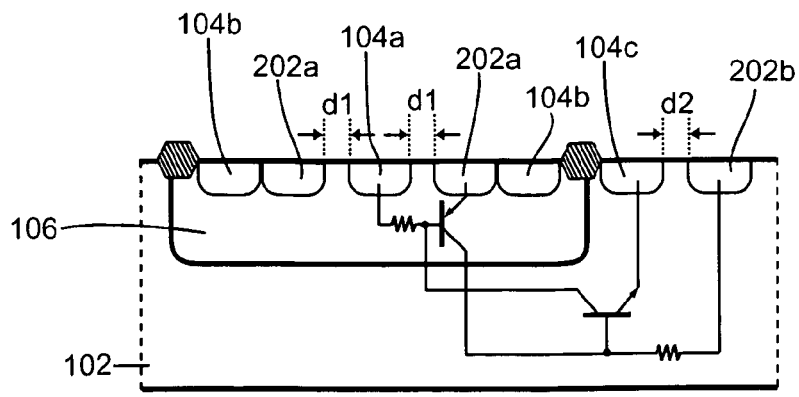
FIG. 2A~2D schematically show the partial cross-sectional diagrams of two relative distances for controlling a trigger voltage and a holding current according to the embodiment of the present invention.
Figure 2B:
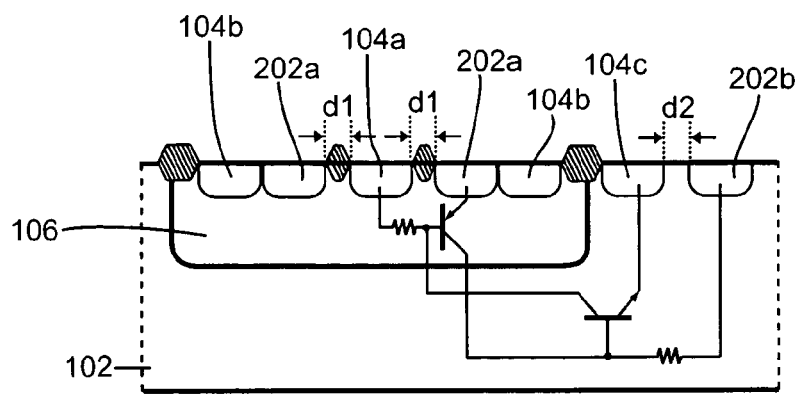
Figure 2C:
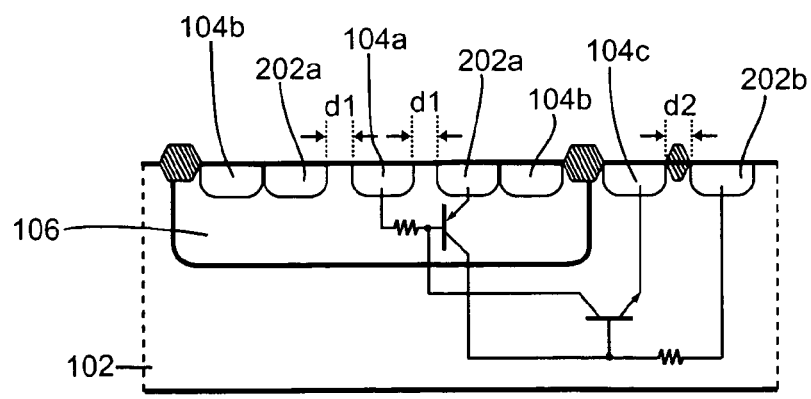
Figure 2D:
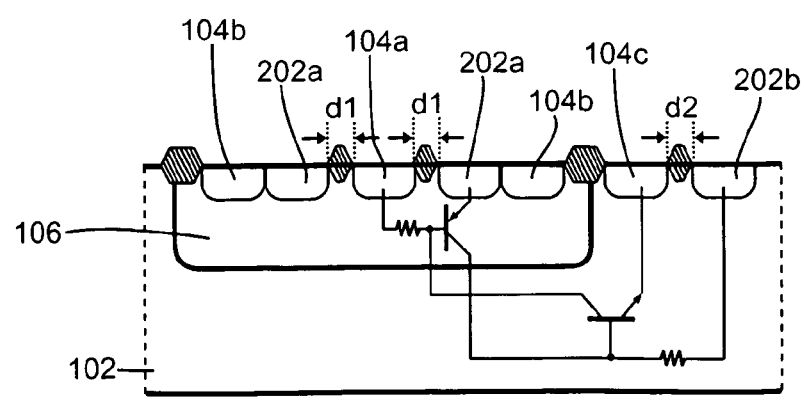

In accordance with the present invention, FIG. 2A~2D schematically show the partial cross-sectional diagrams illustrating the relative distance (i.e. the first distance $d_1$) between the first N+ doped region 104a and the first P+ doped region 202a, and the relative distance (i.e. the second distance $d_2$) of the third N+ doped region 104c and the second P+ doped region 202b. FIG. 2A illustrates a case where the field oxide is not disposed in the first distance $d_1$ and the second distance $d_2$. FIG. 2B illustrates a case where the second field oxide is disposed in the first distance $d_1$ but no field oxide is disposed in the second distance $d_2$. FIG. 2C illustrates a case where the third field oxide is disposed in the second distance $d_2$ but no field oxide is disposed in the first distance $d_1$. FIG. 2D illustrates a case where the second field oxide is disposed in the first distance $d_1$ and the third field oxide is disposed in the second distance $d_2$. The holding current of the ESD device 100 can be determined in response to the variation of the first distance $d_1$ and the second distance $d_2$. When the first distance $d_1$ and the second distance $d_2$ increase, the internal resistance between the first N+ doped region 104a and the first P+ doped region 202a, and the internal resistance between the third N+ doped region 104c and the second P+ doped region 202b increase respectively. In addition, the magnitude of the holding current of the ESD device 100 varies linearly in inverse proportion to the value of the distances $d_1$ and $d_2$. Therefore, for different ESD specification demands, the holding current of the ESD device can be set to a specific value to improve the latch-up immunity.

Figure 3:
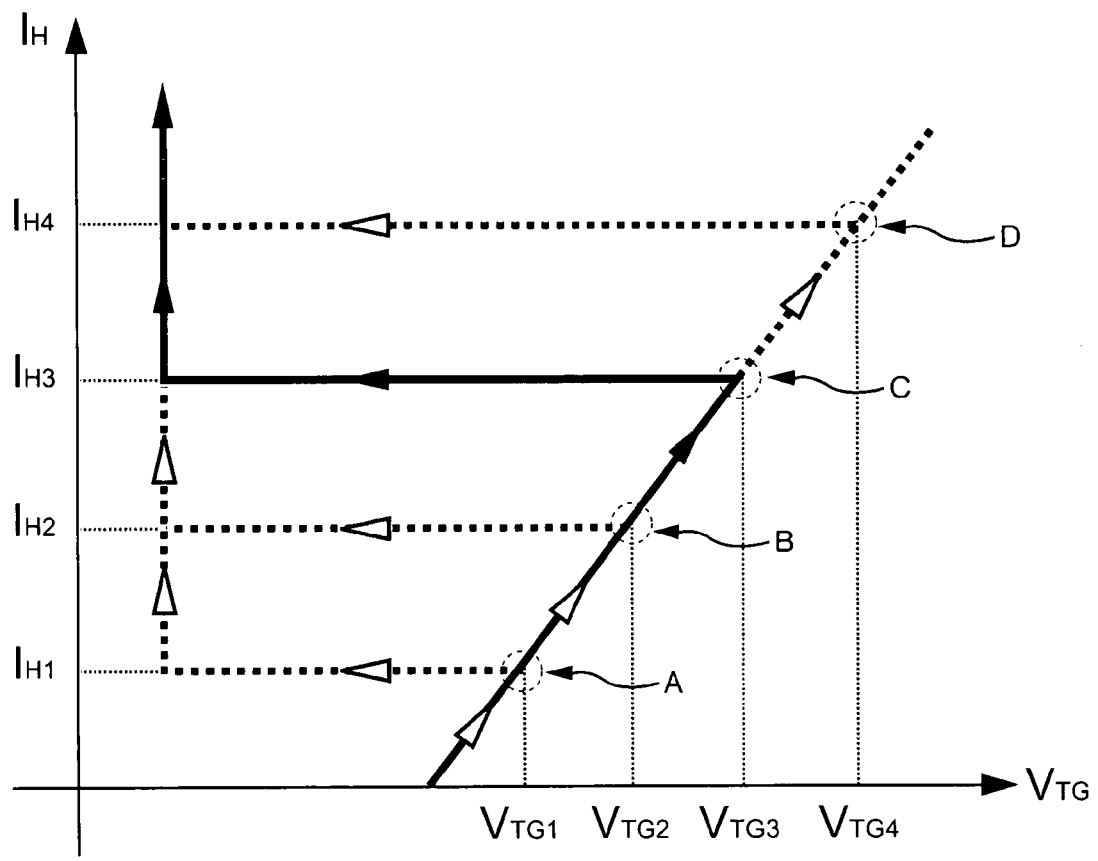
FIG. 3 schematically shows a curve diagram illustrating the relationship between the trigger voltage and the holding current of the ESD device according to the embodiment of the present invention.

FIG. 3 schematically shows a curve diagram illustrating the relationship between the holding current $I_H$ and the trigger voltage $V_{TG}$ of the ESD device 100 under different conditions including $V_{TG4}>V_{TG3}>V_{TG2}>V_{TG1}$ and $I_{H4}>I_{H3}>I_{H2}>I_{H1}$. Referring to FIG. 3, when the distances $d_1$ and/or $d_2$ decrease, the trigger point of the curve moves toward a point D and the trigger voltage $V_{TG}$ and the holding current $I_H$ are both increased. Therefore, the latch-up immunity of the ESD device 100 is enhanced. On the contrary, when the distances $d_1$ and/or $d_2$ increase, the trigger point of the curve moves toward a point A and the trigger voltage $V_{TG}$ and the holding current $I_H$ are both decreased. Therefore, the latch-up immunity of the ESD device 100 is decreased. It is known from the linear relationship of the trigger points A, B, C, and D, the holding current $I_H$ can be linearly set to an arbitrary value by modulating the distances $d_1$ and $d_2$. In other words, when the distances $d_1$ and/or $d_2$ decrease, the trigger voltage $V_{TG}$ of the ESD device 100 would increase, and the holding current $I_H$ of the ESD device 100 will be higher. By modulating the distances $d_1$ and $d_2$, the holding current $I_H$ can be set to a specific value under the same process condition, which preferably increases the latch-up immunity of the ESD device 100 without adjusting process.

Figure 4:
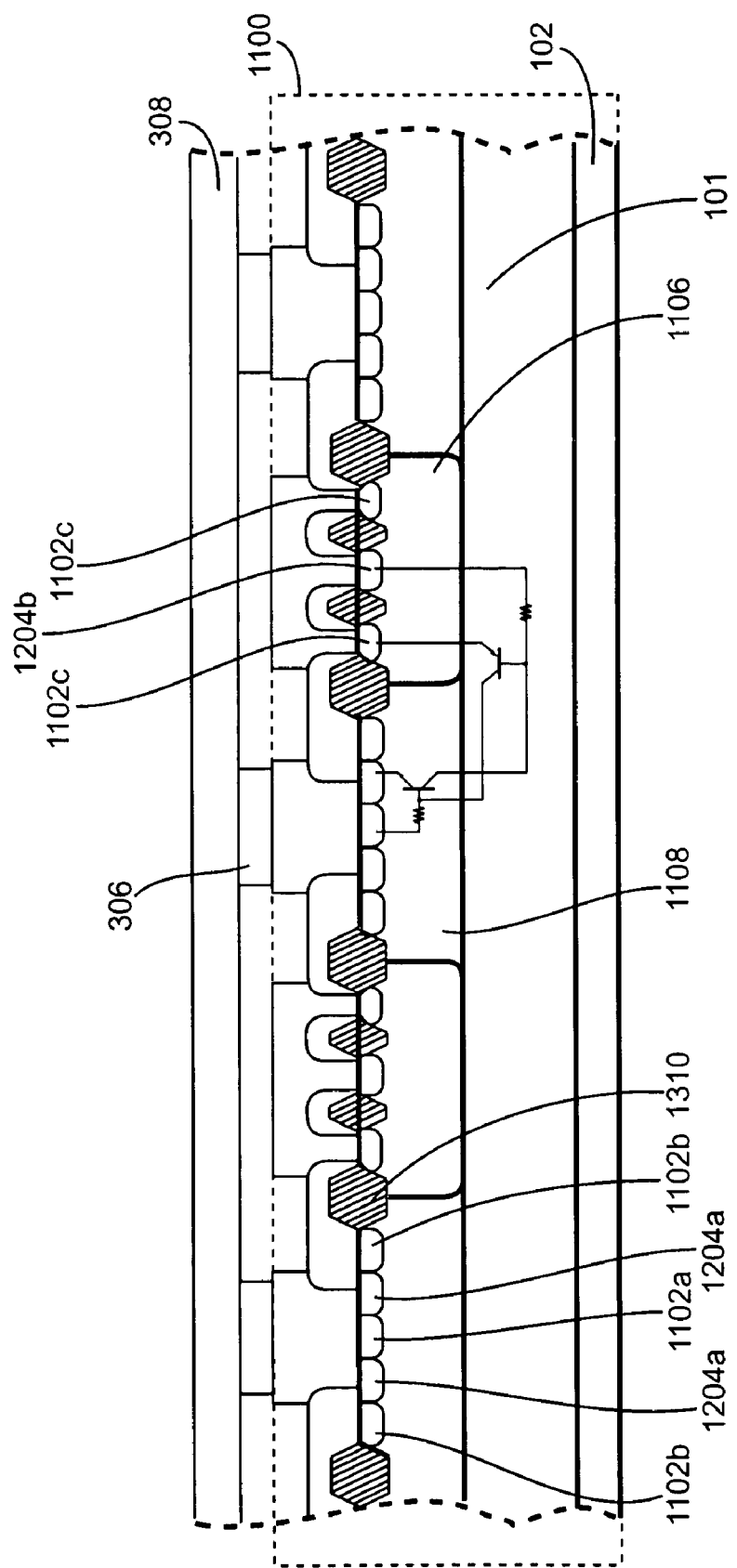
FIG. 4 schematically shows a cross-sectional diagram of an ESD device according to another embodiment of the present invention.

FIG. 4 schematically shows a cross-sectional diagram of an ESD device 1100 according to another embodiment of the present invention. The ESD device 1100 is a complementary structure of the ESD device 100 to show that the ESD device with controllable holding current can also be formed in a complementary process.

In the ESD device 1100, there are an N-buried layer 101 formed in the P-type substrate 102, an N-well 1106 formed on the N-buried layer 101, and a P-well 1108. The P-well 1108 can be formed on a geometry area of the P-type substrate 102 surrounded by the N-buried layer 101 and the N-well 1106 or by P-type ions doping.

The ESD device 1100 of FIG. 4 presents complementary polarity of the ESD device 100 illustrated in FIG. 1. The equivalent transistors illustrated in FIG. 4 also have different polarity from the equivalent transistors illustrated in FIG. 1. A third P+ doped region 1102c, the N-well 1106, the P-well 1108, and a fifth N+ doped region 1204a together form the equivalent SCR. A third electrode is electrically coupled to a third P+ doped region 1102c and a fourth N+ doped region 1204b via a third electric conductor. A fourth electrode is electrically coupled to the fifth N+ doped region 1204a and a fourth P+ doped region 1102a via a fourth electric conductor. In the present embodiment, the fourth electrode is electrically coupled to a pad 308 through a via 306, and a fifth P+ doped region 1102b is formed between the fifth N+ doped region 1204a and a fourth field oxide 1310. The fifth P+ doped region 1102b is isolated from the third P+ doped region 1102c by the fourth field oxide 1310.

In the ESD device 1100, a third distance is kept between the third P+ doped region 1102c and the fourth N+ doped region 1204b, and a fourth distance is kept between the fifth N+ doped region 1204a and the fourth P+ doped region 1102a. Similar to the previous embodiment, a fifth field oxide and a sixth field oxide may or may not dispose to specify the third distance and the fourth distance. Therefore, the holding current of the ESD device 1100 can be set to a specific value by modulating the third distance and the fourth distance without changing the process condition. To illustrate in an example, the third distance and/or the fourth distance may be set to zero, so as to enlarge the holding current of the ESD device 1100. Moreover, the ESD device 1100 may be formed under the pad 308, and connected with the pad 308 by metal. Since the ESD device 1100 is formed under the pad 308, the practical area and cost during the IC manufacturing are effectively reduced.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. An electrostatic discharge (ESD) device with controllable holding current, comprising:
   a P-type substrate;
   an N-well, formed in said P-type substrate;
   a first N+ doped region, formed in said N-well;
   a first P+ doped region, formed in said N-well, wherein a first distance is kept between said first P+ doped region and said first N+ doped region;
   a second N+ doped region, formed between said first P+ doped region and a first field oxide;
   a third N+ doped region, formed inside said P-type substrate and outside said N-well, wherein said third N+ doped region is isolated from said N-well, and said third N+ doped region is isolated from said second N+ doped region by said first field oxide;
   a second P+ doped region, formed inside said P-type substrate and outside said N-well, wherein said second P+ doped region is isolated from said N-well, and a second distance is kept between said second P+ doped region and said third N+ doped region, and a holding current of the ESD device is determined by modulating said first distance and said second distance, wherein said first distance and said second distance are different one from another;
   a first electrode, electrically coupled to said first P+ doped region and said first N+ doped region via a first electric conductor; and
   a second electrode, electrically coupled to said third N+ doped region and said second P+ doped region via a second electric conductor.

2. The ESD device of claim 1, wherein said first P+ doped region is isolated from said first N+ doped region by a second field oxide.

3. The ESD device of claim 1, wherein said holding current of the ESD device is in inverse proportion to said first distance.

4. The ESD device of claim 3, wherein said first distance is set to zero to enlarge said holding current.

5. The ESD device of claim 1, wherein said second P+ doped region is isolated from said third N+ doped region by a third field oxide.

6. The ESD device of claim 1, wherein said holding current of the ESD device is in inverse proportion to said second distance.

7. The ESD device of claim 6, wherein said second distance is set to zero to enlarge said holding current.

8. The ESD device of claim 1, wherein both of said first electric conductor and said second electric conductor are metal.

9. The ESD device of claim 1, wherein said first P+ doped region is adjacent to said second N+ doped region.

10. The ESD device of claim 1, wherein one of said first electrode and said second electrode is electrically coupled to a pad, and the other one is electrically coupled to a power terminal or a ground terminal.

11. The ESD device of claim 10, wherein the ESD device is disposed under said pad.

12. An electrostatic discharge (ESD) device with controllable holding current, comprising:
   a P-type substrate;
   an N-buried layer, formed in said P-type substrate;
   an N-well, formed on said N-buried layer;
   a P-well, formed on said N-buried layer and adjacent to said N-well;
   a third P+ doped region, formed in said N-well;

a fourth N+ doped region, formed in said N-well, wherein a third distance is kept between said third P+ doped region and said fourth N+ doped region;

a fifth N+ doped region, formed in said P-well;

a fourth P+ doped region, formed in said P-well, wherein a fourth distance is kept between said fourth P+ doped region and said fifth N+ doped region, and a holding current of the ESD device is determined by modulating said third distance and said fourth distance, wherein said third distance and said fourth distance are different one from another;

a fifth P+ doped region, formed between said fifth N+ doped region and a fourth field oxide, wherein said fifth P+ doped region is isolated from said third P+ doped region by said fourth field oxide;

a third electrode, electrically coupled to said fourth N+ doped region and said third P+ doped region via a third electric conductor; and a fourth electrode, electrically coupled to said fourth P+ doped region and said fifth N+ doped region via a fourth electric conductor.

13. The ESD device of claim 12, wherein said third P+ doped region is isolated from the fourth N+ doped region by a fifth field oxide.

14. The ESD device of claim 12, wherein said holding current of the ESD device is in inverse proportion to said third distance.

15. The ESD device of claim 14, wherein said third distance is set to zero to enlarge said holding current.

16. The ESD device of claim 12, wherein said fourth P+ doped region is isolated from said fifth N+ doped region by a sixth field oxide.

17. The ESD device of claim 12, wherein said holding current of the ESD device is in inverse proportion to said fourth distance.

18. The ESD device of claim 17, wherein said fourth distance is set to zero to enlarge said holding current.

19. The ESD device of claim 12, wherein both of said third electric conductor and said fourth electric conductor are metal.

20. The ESD device of claim 12, wherein said fifth N+ doped region is adjacent to said fifth P+ doped region.

21. The ESD device of claim 12, wherein one of said third electrode and said fourth electrode is electrically coupled to a pad, and the other one is electrically coupled to a power terminal or a ground terminal.

22. The ESD device of claim 21, wherein the ESD device is disposed under said pad.

23. The ESD device of claim 12, wherein said P-well is formed on a geometry area of said P-type substrate surrounded by said N-buried layer and said N-well or by P-type ions doping.

* * * * *